(12) United States Patent
Sawataishi et al.

(10) Patent No.: US 9,735,021 B2
(45) Date of Patent: *Aug. 15, 2017

(54) ETCHING METHOD

(71) Applicant: Tokyo Electron Limited, Tokyo (JP)

(72) Inventors: Masayuki Sawataishi, Hwaseong (KR); Tomonori Miwa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/166,681

(22) Filed: May 27, 2016

(65) Prior Publication Data

US 2016/0351407 A1 Dec. 1, 2016

(30) Foreign Application Priority Data

May 29, 2015 (JP) ................... 2015-109568

(51) Int. Cl.

| H01L 21/302 | (2006.01) |
|---|---|
| H01L 21/461 | (2006.01) |
| H01L 21/3065 | (2006.01) |
| H01L 21/308 | (2006.01) |
| H01L 27/11556 | (2017.01) |
| H01L 21/311 | (2006.01) |
| H01L 27/11582 | (2017.01) |
| H01L 21/67 | (2006.01) |
| H01L 21/683 | (2006.01) |
| H01J 37/32 | (2006.01) |

(52) U.S. Cl.
CPC .... *H01L 21/3065* (2013.01); *H01J 37/32091* (2013.01); *H01J 37/32366* (2013.01); *H01J 37/32724* (2013.01); *H01L 21/308* (2013.01); *H01L 21/31116* (2013.01); *H01L 21/31144* (2013.01); *H01L 21/67109* (2013.01); *H01L 21/6831* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| 2013/0043455 A1* | 2/2013 | Bateman ............. H01L 27/2454 257/5 |
|---|---|---|
| 2013/0059450 A1 | 3/2013 | Le Gouil |

(Continued)

*Primary Examiner* — Stephanie Duclair
(74) *Attorney, Agent, or Firm* — Pearne & Gordon LLP

(57) ABSTRACT

An etching method of etching a first region including a multilayered film, in which silicon oxide films and silicon nitride films are alternately stacked, and a second region including a single-layered silicon oxide film is provided. The etching method includes a first plasma process of generating plasma of a first processing gas containing a fluorocarbon gas and an oxygen gas within a processing vessel of a plasma processing apparatus; and a second plasma process of generating plasma of a second processing gas containing a hydrogen gas, nitrogen trifluoride gas, a hydrogen bromide gas and a carbon-containing gas within the processing vessel. A temperature of an electrostatic chuck is set to a first temperature in the first plasma process, and the temperature of the electrostatic chuck is set to a second temperature lower than the first temperature in the second plasma process.

6 Claims, 9 Drawing Sheets

(56) References Cited

U.S. PATENT DOCUMENTS

2013/0102157 A1* 4/2013 Ozu .................. H01L 29/6656
                                                           438/723
2015/0037982 A1* 2/2015 Ogawa ............. H01J 37/32091
                                                           438/715

* cited by examiner

ETCHING METHOD

CROSS-REFERENCE TO RELATED APPLICATION

This application claims the benefit of Japanese Patent Application No. 2015-109568 filed on May 29, 2015, the entire disclosures of which are incorporated herein by reference.

TECHNICAL FIELD

The embodiments described herein pertain generally to an etching method; and, more particularly, to a method of etching a first region including a multilayered film in which a plurality of silicon oxide films and a multiplicity of silicon nitride films are alternately stacked and a second region including a single-layered silicon oxide film.

BACKGROUND

As one kind of semiconductor devices, a NAND type flash memory device having a three-dimensional structure is known in the art. In the manufacture of the NAND type flash memory device having the three-dimensional structure, by performing an etching process of etching a multilayered film in which silicon oxide films and silicon nitride films are alternately stacked on top of each other, a deep hole is formed in the multilayered film. This etching process is described in Patent Document 1.

To be specific, in Patent Document 1, there is disclosed a method of etching a multilayered film by exposing a processing target object having a mask on the multilayered film to plasma of a processing gas.

Patent Document 1: US Patent Application Publication No. 2013/0059450

A processing target object to be etched may include a first region including a multilayered film in which silicon oxide films and silicon nitride films are alternately stacked on top of each other; and a second region including a single-layered silicon oxide film. It is required to form spaces such as a hole and/or a trench in both of the first region and the second region by etching the processing target object. Further, when performing this etching process, it is also required that a depth of the space formed in the first region and a depth of the space formed in the second region be substantially same, a deformation degree of a planar shape of the space be small, and, especially, the deformation degree of the space at a bottom portion (deep portion) thereof be small. Here, the deformation of the space refers to a phenomenon that an actually formed space has a planar shape different from a required planar shape. For example, if the required planar shape is a circular shape, the deformation of space refers to a phenomenon that the actually formed space has a planar shape different from the circular shape.

SUMMARY

In one exemplary embodiment, an etching method of etching a first region and a second region of a processing target object is provided. The first region includes a multilayered film in which silicon oxide films and silicon nitride films are alternately stacked. The second region includes a single-layered silicon oxide film. The processing target object includes a mask provided with openings on the first region and the second region. The etching method includes (i) mounting the processing target object on an electrostatic chuck provided within a processing vessel of a plasma processing apparatus; (ii) generating plasma of a first processing gas containing a fluorocarbon gas and an oxygen gas within the processing vessel (hereinafter, referred to as "first plasma process"); and (iii) generating plasma of a second processing gas containing a hydrogen gas, a nitrogen trifluoride gas, a hydrogen bromide gas and a carbon-containing gas within the processing vessel (hereinafter, referred to as "second plasma process"). Here, a temperature of the electrostatic chuck is set to a first temperature in the first plasma process, and the temperature of the electrostatic chuck is set to a second temperature lower than the first temperature in the second plasma process.

The etching by the plasma of the first processing gas is characterized in that an etching rate of the second region is higher than an etching rate of the first region. Further, in the etching by the plasma of the first processing gas, the deformation degree of the formed space at the bottom portion thereof increases. Further, in the etching by the plasma of the first processing gas, the higher the temperature of the electrostatic chuck, i.e., the temperature of the processing target object becomes, the smaller the deformation degree of the openings of the mask becomes, though the etching rate of the first region decreases.

The etching by the plasma of the second processing gas is characterized in that the etching rate of the first region is higher than the etching rate of the second region, and the deformation degree of the formed spaces at the bottom portions thereof is small. Further, in the etching by the plasma of the second processing gas, the lower the temperature of the electrostatic chuck, i.e., the temperature of the processing target object becomes, the higher the etching rate of the first region becomes. Further, in the etching by the plasma of the second processing gas, when the temperature of the electrostatic chuck, i.e., the temperature of the processing target object is low, it is possible to suppress occurrence of a phenomenon that a portion of the space in the depth direction thereof is enlarged in a transverse direction.

Since the etching by the plasma of the first processing gas has the above-described characteristics, the space formed in the second region is deeper than the space formed in the first region upon the completion of the first plasma process. Further, the deformation degree of the spaces at the bottom portions thereof is increased. In addition, in the first plasma process, since the temperature of the electrostatic chuck is set to the first temperature which is relatively high, the etching by the plasma of the first processing gas is performed in the state that the temperature of the processing target object is set to a relatively higher temperature. Accordingly, the deformation degree of the openings of the mask is decreased after the first plasma process is completed.

The etching by the plasma of the second processing gas has the above-described characteristics. Accordingly, after the second plasma process is completed, a difference in a depth of the space formed in the first region and a depth of the space formed in the second region is reduced or removed. Further, the deformation degree of the spaces at the bottom portions thereof that has occurred in the first plasma process is decreased. Thus, according to the etching method, the depths of the spaces formed in the first region and the second region becomes substantially same, and the deformation degree of the spaces at the bottom portions thereof is decreased. Furthermore, in the second plasma process, since the temperature of the electrostatic chuck is set to the second temperature which is relatively low, the etching by the plasma of the second processing gas is performed in the state that the temperature of the processing target object is set to a relatively lower temperature. Accordingly, in the second plasma process, the enlargement of the space in the transverse direction can be suppressed, and the etching rate of the first region is increased.

The first temperature may be in the range from 20° C. to 40° C., and the second temperature may be lower than 20° C.

The processing target object may include, as a base of the first region and the second region, an underlying layer made of silicon or tungsten. Further, the first plasma process and the second plasma process may be performed until immediately before the underlying layer is exposed. That is, the first plasma process and the second plasma process are performed such that the first region and the second region are slightly left on the underlying layer. The method may further include generating plasma of a third processing gas containing a fluorocarbon gas and an oxygen gas within the processing vessel (hereinafter, referred to as "third plasma process"). The temperature of the electrostatic chuck is set to a third temperature higher than the first temperature in the third plasma process. The plasma of the third processing gas generated in the third plasma process does not substantially etch the underlying layer. Further, in the third plasma process, since the temperature of the electrostatic chuck is set to the third temperature which is relatively high, the temperature of the processing target object is increased, so that an adhesion coefficient of active species to the underlying layer is reduced. Therefore, it is possible to suppress damage of the underlying layer that might be caused by the etching during a period in which the underlying layer is exposed. Further, the third temperature may be equal to or higher than 70° C.

A sequence including the first plasma process and the second plasma process may be repeated multiple times. According to this exemplary embodiment, it is possible to etch the first region and the second region while reducing the difference in the depths of the spaces formed in the first region and the second region and the difference in the deformation degree of the spaces.

According to the exemplary embodiments as described above, in the technique of etching the first region including the multilayered film, in which silicon oxide films and silicon nitride films are alternately stacked, and the second region including the single-layered silicon oxide film, it is possible to form spaces in the first region and the second region while allowing the spaces formed in the first region and the second region to have substantially the same depth and, also, allowing the deformation degree of the space at the bottom portion thereof to be small.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
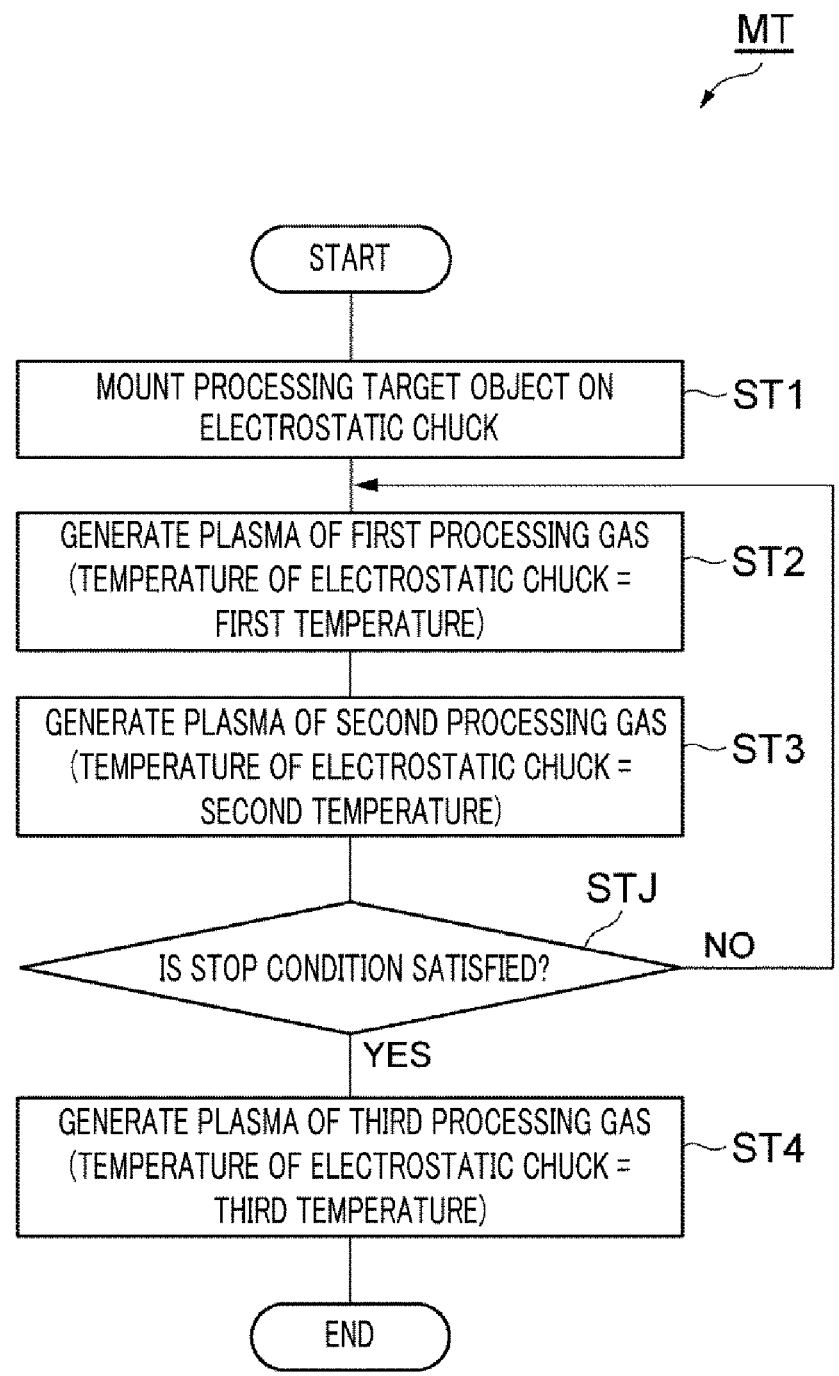
FIG. 1 is a flowchart for describing an etching method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a flowchart for describing an etching method according to an exemplary embodiment. The method MT shown in FIG. 1 is directed to forming spaces such as a hole or a trench both on a first region and a second region of a processing target object (hereinafter, referred to as "wafer") W by etching the first region and the second region. This method MT is applicable to the manufacture of, for example, a NAND type flash memory having a three-dimensional structure.

Figure 2:
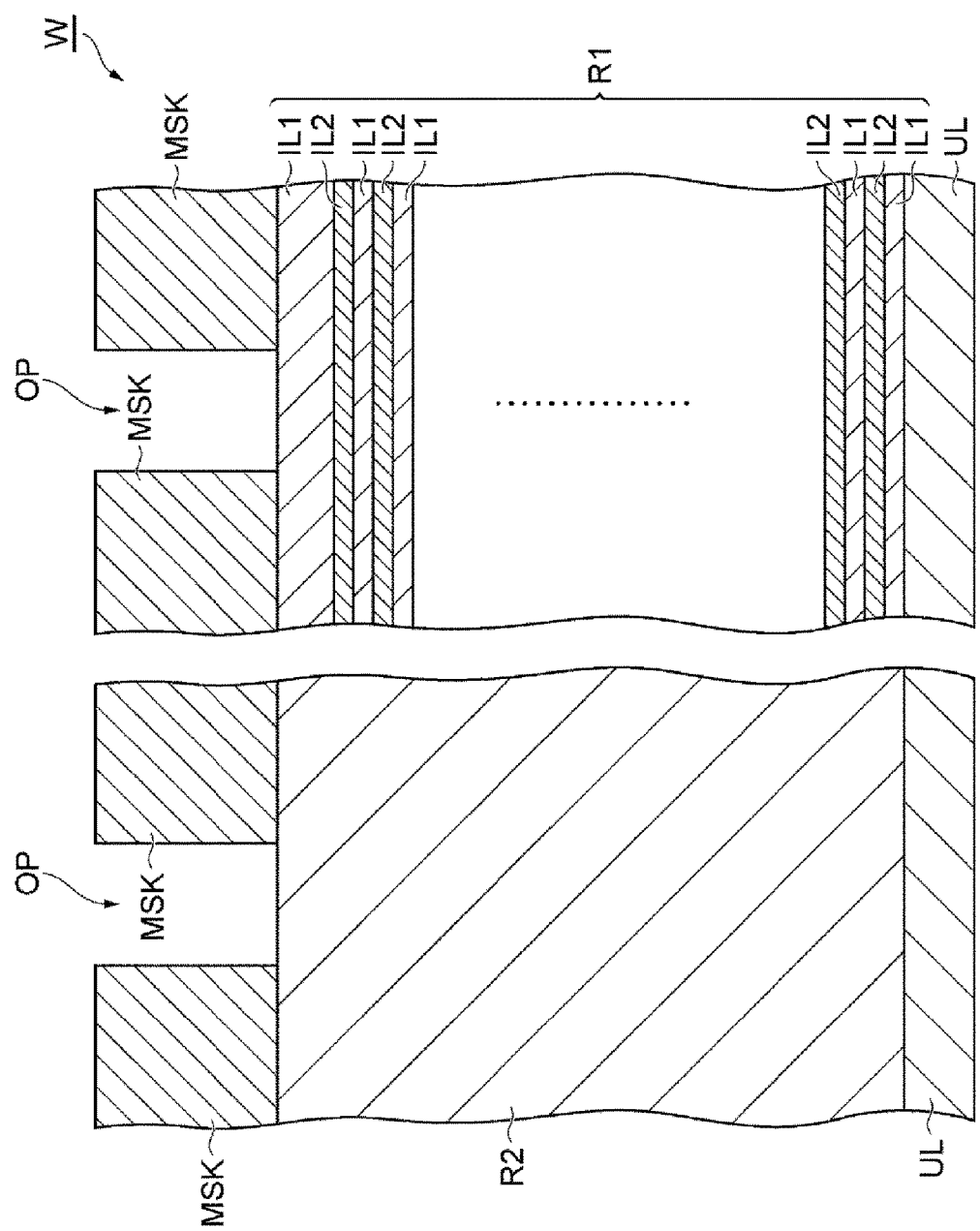
FIG. 2 is a cross sectional view illustrating an example of a processing target object on which the etching method of FIG. 1 is performed.

FIG. 2 is a cross sectional view illustrating an example of the processing target object on which the etching method of FIG. 1 is performed. The wafer W shown in FIG. 2 has an underlying layer UL, a first region R1, a second region R2 and a mask MSK. The underlying layer UL is provided on a substrate. The underlying layer UL is made of, by way of example, but not limitation, silicon or tungsten. As a more specific example, the underlying layer UL is a polycrystalline silicon layer.

The first region R1 and the second region R2 are provided on a surface of the underlying layer UL. The first region R1 is formed of a multilayered film. The multilayered film includes multiple silicon oxide films IL1 and multiple silicon nitride films IL2 which are alternately stacked on top of each other. A thickness of each of the silicon oxide films IL1 is in the range from, e.g., 5 nm to 50 nm, and a thickness of each of the silicon nitride films IL2 is in the range from, e.g., 10 nm to 75 nm. According to the exemplary embodiment, the multilayered film in the first region R1 has twenty-four or more layers in total. The second region R2 is formed of a single-layered silicon oxide film. A thickness of the second region R2 is substantially the same as a thickness of the first region R1.

The mask MSK is provided on the first region R1 and the second region R2. The mask MSK is provided with a pattern for forming spaces such as holes or trenches in the first region R1 and the second region R2. That is, the mask MSK is provided with openings OP on the first region R1 and the second region R2. The mask MSK may be made of, by way of non-limiting example, amorphous carbon. Alternatively, the mask MSK may be made of, for example, organic polymer, poly silicon, or amorphous silicon.

Figure 3:
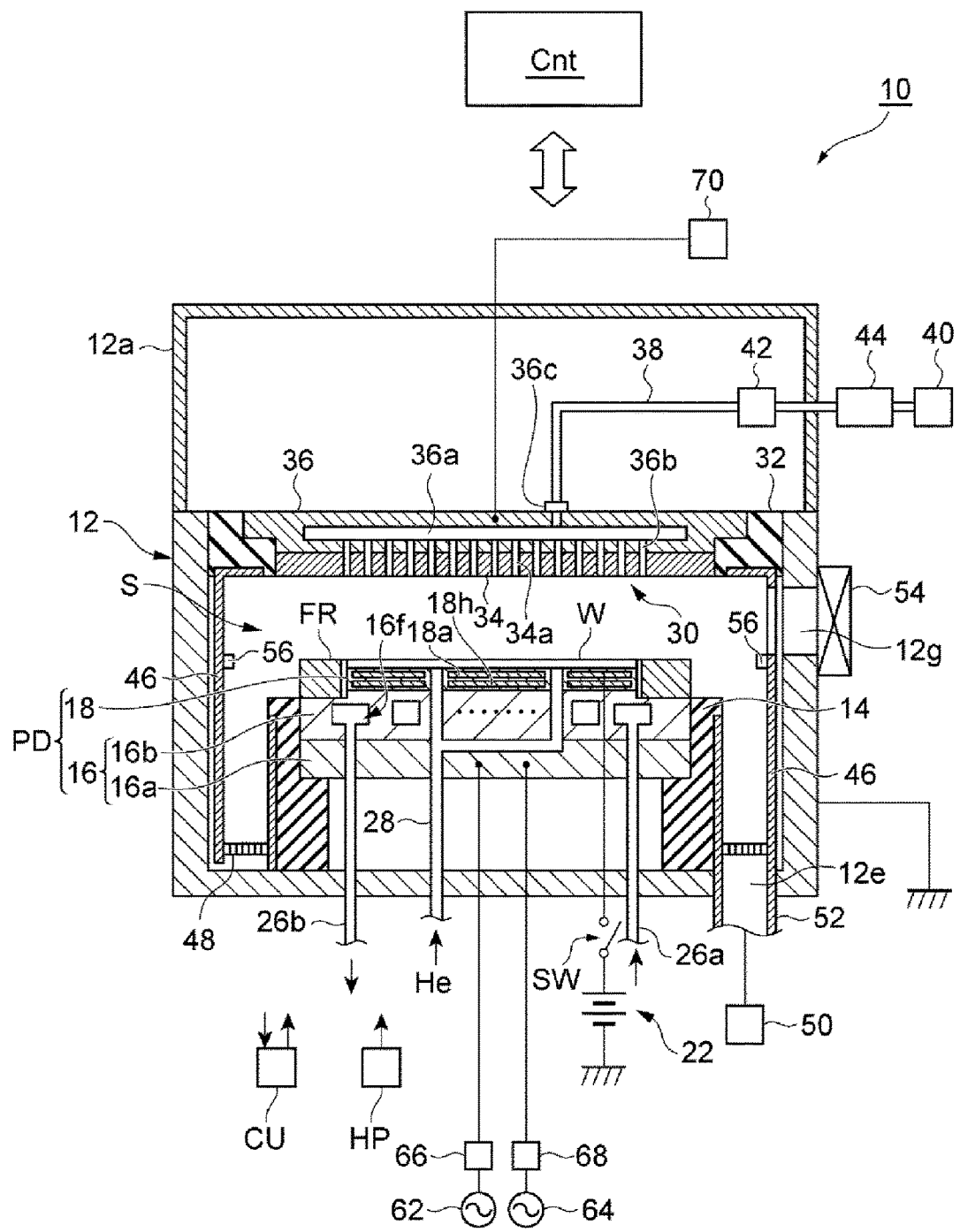
FIG. 3 is a diagram schematically illustrating an example of a plasma processing apparatus in which the etching method of FIG. 1 is performed.

Referring back to FIG. 1, in the process ST1 of the method MT, the wafer W is carried in a processing vessel of a plasma processing apparatus and mounted on an electrostatic chuck of the plasma processing apparatus. FIG. 3 is a diagram schematically illustrating an example of the plasma processing apparatus in which the method shown in FIG. 1 is performed. FIG. 3 illustrates a cross section of the example plasma processing apparatus.

The plasma processing apparatus 10 shown in FIG. 3 is configured as a capacitively coupled plasma etching apparatus and includes a substantially cylindrical processing vessel 12. The processing vessel 12 is formed of, by way of example, but not limitation, aluminum, and an inner wall surface of the processing vessel 12 is anodically oxidized. This processing vessel 12 is frame-grounded.

A supporting member 14 is provided on a bottom portion of the processing vessel 12. The supporting member 14 has a substantially cylindrical shape and is made of an insulating material such as, but not limited to, quartz or alumina. Within the processing vessel 12, the supporting member 14 is vertically extended from the bottom portion of the processing vessel 12. The processing vessel 12 also includes a mounting table PD, and the mounting table PD is supported on the supporting member 14.

The mounting table PD includes a lower electrode 16 and an electrostatic chuck 18. The lower electrode 16 includes a first member 16a and a second member 16b. Each of the first member 16a and the second member 16b is made of a metal such as aluminum and has a substantially disk shape. The second member 16b is provided on the first member 16a and is electrically connected to the first member 16a.

The electrostatic chuck 18 is provided on the lower electrode 16. Specifically, the electrostatic chuck 18 is provided on the second member 16b. The electrostatic chuck 18 is configured to hold the wafer W which is placed on a top surface thereof. The electrostatic chuck 18 includes a substantially disk-shaped insulating film; and an electrode 18a embedded in the insulating film. The electrode 18a is connected to a DC power supply 22 via a switch SW. If a DC voltage from the DC power supply 22 is applied to the electrode 18a of the electrostatic chuck 18, an electrostatic force such as a Coulomb force is generated. The electrostatic chuck 18 is configured to attract and hold the wafer W by the generated electrostatic force.

A focus ring FR is provided on a peripheral portion of the lower electrode 16. The focus ring FR has an annular plate shape and is provided to surround an edge of the wafer W and an edge of the electrostatic chuck 18. The focus ring FR is made of a material which is appropriately selected based on a material of a target film to be etched. By way of non-limiting example, the focus ring FR may be made of quartz.

The plasma processing apparatus 10 also includes a temperature control device configured to control a temperature of the electrostatic cuck 18. To elaborate, a flow path 16f for a fluid is provided within the lower electrode 16. The flow path 16f is connected to a pipeline 26a and a pipeline 26b, and the pipelines 26a and 26b are connected to a chiller unit CU provided outside the processing vessel 12. A heat transfer medium is supplied into the flow path 16f from the chiller unit CU via the pipeline 26a. The heat transfer medium supplied into the flow path 16f is returned back into the chiller unit CU via the pipeline 26b. In this way, the heat transfer medium is circulated between the flow path 16f and the chiller unit CU. Accordingly, the temperature of the electrostatic chuck 18 is controlled, so that a temperature of the wafer W is controlled.

Further, the plasma processing apparatus 10 is also equipped with a gas supply line 28 as a part of the temperature control device. A heat transfer gas, for example, a He gas, is supplied from a heat transfer gas supply device into a gap between a top surface of the electrostatic chuck 18 and a rear surface of the wafer W. In addition, as a part of the temperature control device, a heater 18h is provided within the electrostatic chuck 18. The heater 18h is connected to a heater power supply HP. Heat is generated from the heater 18h by a power supplied from the heater power supply HP. Accordingly, the temperature of the electrostatic chuck 18 is controlled, so that the temperature of the wafer W is also controlled.

Moreover, the plasma processing apparatus 10 further includes the upper electrode 30. The upper electrode 30 is provided above the mounting table PD, facing the mounting table PD. A processing space S in which a plasma process is performed on the wafer W is formed between the upper electrode 30 and the mounting table PD.

The upper electrode 30 is supported at an upper portion of the processing vessel 12 with an insulating shield member 32 therebetween. The upper electrode 30 may include a ceiling plate 34 and a supporting body 36. The ceiling plate 34 directly faces the processing space S and is provided with a multiple number of gas discharge holes 34a. The ceiling plate 34 may be made of a conductor or a semiconductor having low resistance and low Joule heat.

The supporting body 36 is configured to support the ceiling plate 34 in a detachable manner, and is made of a conductive material such as, but not limited to, aluminum. The supporting body 36 may have a water-cooling structure. A gas diffusion space 36a is formed within the supporting body 36. A multiple number of gas through holes 36b is extended downwards from the gas diffusion space 36a, and these gas through holes 36b respectively communicate with the gas discharge holes 34a. Further, the supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources for a first processing gas, a second processing gas and a third processing gas. To elaborate, the gas sources may include one or more gas sources of a fluorocarbon gas, a gas source of an oxygen gas ($O_2$ gas), a gas source of a hydrogen gas ($H_2$ gas), a gas source of a hydrofluorocarbon gas, a gas source of a nitrogen trifluoride gas ($NF_3$ gas), a gas source of a hydrogen bromide gas (HBr gas), a gas source of a carbon-containing gas, and a gas source of a rare gas. As an example, the fluorocarbon gas may contain at least one of a $C_4F_6$ gas, a $C_4F_8$ gas and a $CF_4$ gas. The hydrofluorocarbon gas may be, by way of example, but not limitation, a $CH_2F_2$ gas. The carbon-containing gas is any gas containing carbon, and, for example, may be a hydrocarbon gas such as a methane gas ($CH_4$ gas). The rare gas may be, for example, an Ar gas.

The valve group 42 includes a multiple number of valves, and the flow rate controller group 44 includes a multiple number of flow rate controllers such as mass flow controllers (MFC). Each of the gas sources belonging to the gas source group 40 is connected to the gas supply line 38 via each corresponding flow rate controller belonging to the flow rate controller group 44 and each corresponding valve belonging to the valve group 42. In the plasma processing apparatus 10, a gas from a gas source selected from the gas sources is introduced into the processing vessel 12. To be specific, the first processing gas, the second processing gas and the third processing gas are selectively supplied into the processing vessel 12. Details of the first processing gas, the second processing gas and the third processing gas will be elaborated later.

The plasma processing apparatus 10 may further include a grounding conductor 12a. The grounding conductor 12a has a substantially cylindrical shape, and is extended upwards from a sidewall of the processing vessel 12 up to a position higher than the upper electrode 30.

Further, in the plasma processing apparatus 10, a deposition shield 46 is detachably provided along an inner wall of the processing vessel 12. The deposition shield 46 is also provided on an outer side surface of the supporting member 14. The deposition shield 46 is configured to suppress an etching byproduct from adhering to the processing vessel 12, and is formed by coating an aluminum member with ceramics such as $Y_2O_3$.

A gas exhaust plate 48 is provided between the supporting member 14 and the inner wall of the processing vessel 12. The gas exhaust plate 48 is provided with a multiple number of through holes in a plate thickness direction thereof. For example, the gas exhaust plate 48 may implemented by an aluminum member coated with ceramics such as $Y_2O_3$. Further, the processing vessel 12 is also provided with a gas exhaust opening 12e under the gas exhaust plate 48. The gas exhaust opening 12e is connected with a gas exhaust device 50 via a gas exhaust line 52. The gas exhaust device 50 includes a pressure control valve and a vacuum pump such as a turbo molecular pump, and is capable of decompressing the inside of the processing vessel 12 to a required vacuum level. Furthermore, an opening 12g through which the wafer W is transferred is formed at a sidewall of the processing vessel 12, and the opening 12g is opened or closed by a gate valve 54.

Furthermore, a conductive member (GND block) 56 is provided at the inner wall of the processing vessel 12. The conductive member 56 is placed to the inner wall of the processing vessel 12 such that it is located at a position substantially level with the wafer W in a height direction. The conductive member 56 is DC-connected to the ground, and has an effect of suppressing an abnormal electric discharge. Further, the arrangement location of the conductive member 56 may not be limited to the position shown in FIG. 3 as long as it is provided within a plasma generation region.

Further, the plasma processing apparatus 10 further includes a first high frequency power supply 62 and a second high frequency power supply 64. The first high frequency power supply 62 is configured to generate a first high frequency power for plasma generation. The first high frequency power supply 62 generates the first high frequency power having a frequency ranging from 27 MHz to 100 MHz, for example, 40 MHz. The first high frequency power supply 62 is connected to the lower electrode 16 via a matching device 66. The matching device 66 includes a circuit configured to match an output impedance of the first high frequency power supply 62 and an input impedance at a load side (lower electrode 16). Here, the first high frequency power supply 62 may be connected to the upper electrode 30 via the matching device 66.

The second high frequency power supply 64 is configured to generate a second high frequency power for attracting ions into the wafer W, i.e., a high frequency bias power. Specifically, the second high frequency power supply 64 generates the high frequency bias power having a frequency ranging from 400 kHz to 13.56 MHz, e.g., 3 MHz. The second high frequency power supply 64 is connected to the lower electrode 16 via a matching device 68. The matching device 68 includes a circuit configured to match an output impedance of the second high frequency power supply 64 and an input impedance at the load side (lower electrode 16).

Further, the plasma processing apparatus 10 further includes a DC power supply unit 70. The DC power supply unit 70 is connected to the upper electrode 30. The DC power supply unit 70 is configured to generate a negative DC voltage to apply the DC voltage to the upper electrode 30.

In addition, the plasma processing apparatus 10 further includes a control unit Cnt. The control unit Cnt may be implemented by a computer including a processor, a storage unit, an input device, a display device, and the like, and is configured to control individual components of the plasma processing apparatus 10. Through the control unit Cnt, an operator can input commands to manage the plasma processing apparatus 10 through the input device, and an operational status of the plasma processing apparatus 10 can be visually displayed on the display device. Further, in the storage unit of the control unit Cnt, a control program for controlling various processes performed in the plasma processing apparatus 10 by the processor, or a program for allowing each component of the plasma processing apparatus 10 to perform a process according to processing conditions, i.e., a process recipe is stored.

In the exemplary embodiment, the control unit Cnt controls, in each process of the method MT, the individual components of the plasma processing apparatus 10 such as the switch SW, the valves of the valve group 42, the flow rate controllers of the flow rate controller group 44, the gas exhaust device 50, the first high frequency power supply 62, the matching device 66, the second high frequency power supply 64, the matching device 68, the chiller unit CU and the heater power supply HP according to the process recipe for the method MT.

Figure 4:
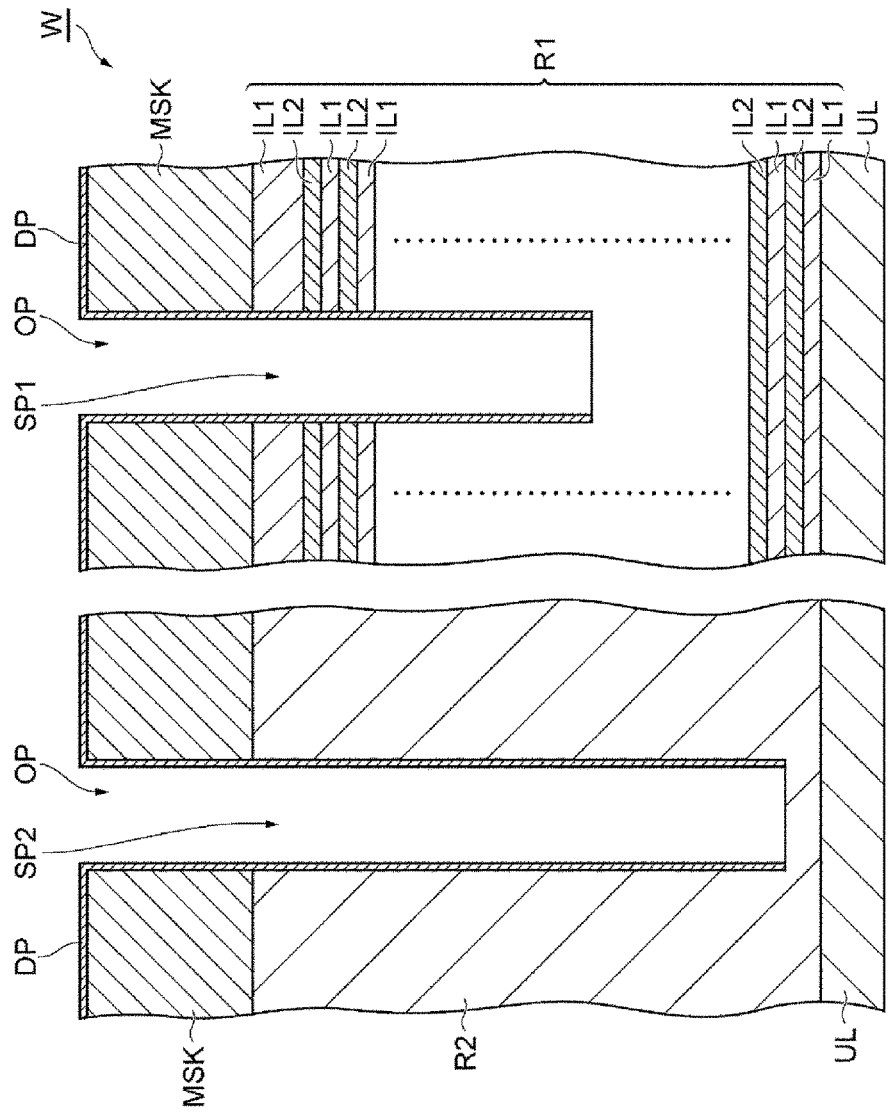
FIG. 4 is a cross sectional view illustrating an example state of the processing target object in the middle of performing the etching method of FIG. 1.
Figure 5:
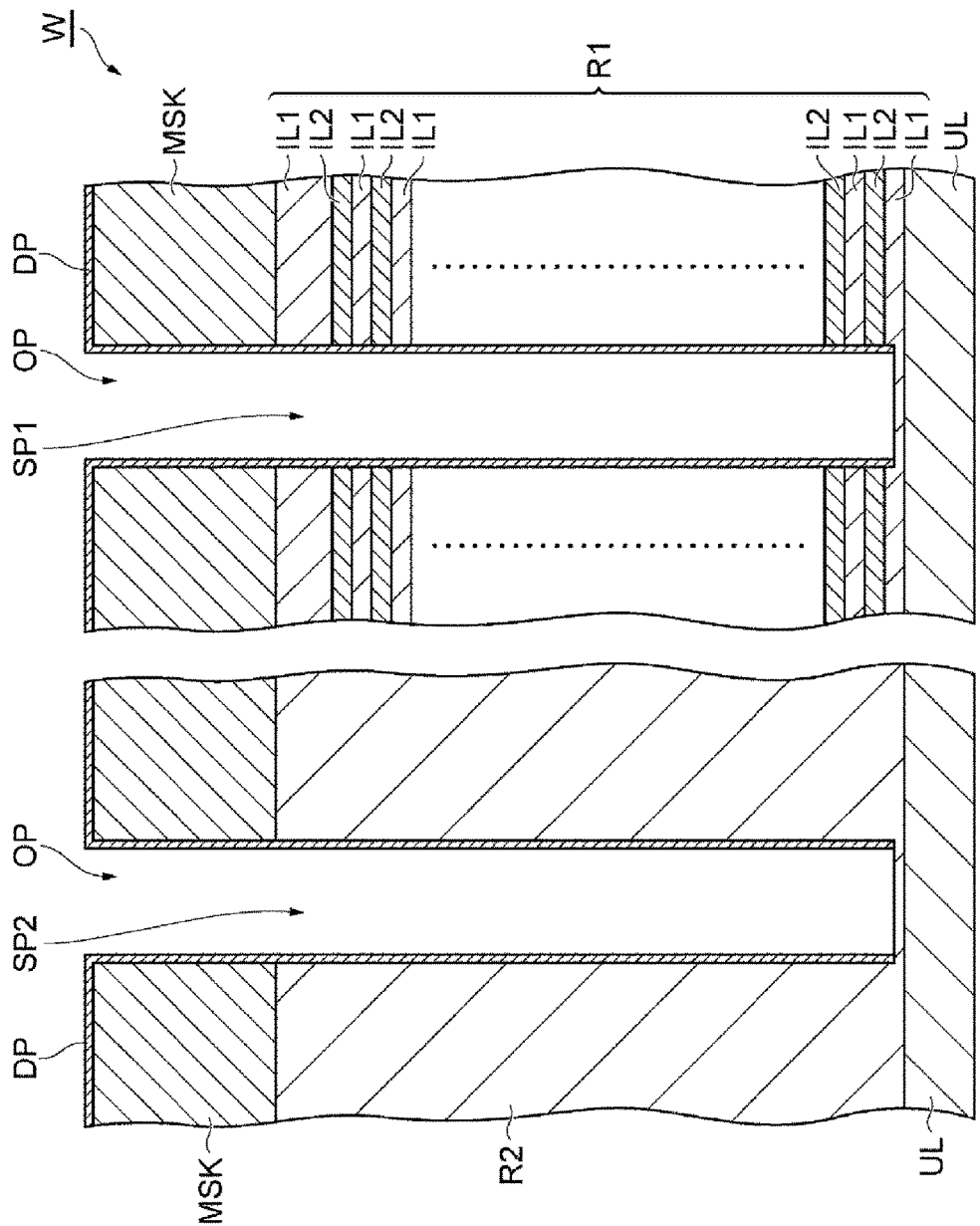
FIG. 5 is a cross sectional view illustrating an example state of the processing target object in the middle of performing the etching method of FIG. 1.
Figure 6:
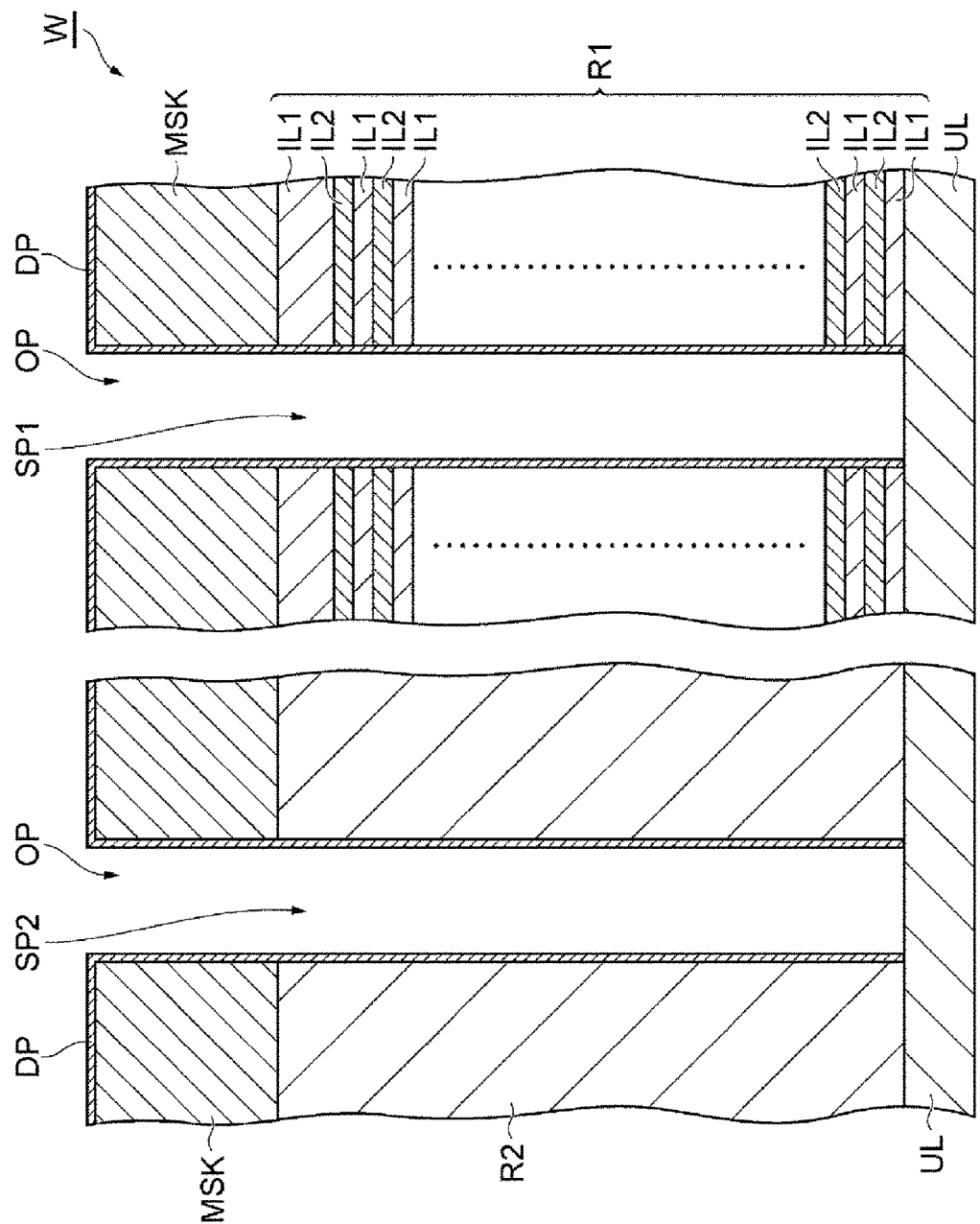
FIG. 6 is a cross sectional view illustrating an example state of the processing target object after performing the etching method of FIG. 1.

Referring back to FIG. 1, the method MT will be further discussed. In the following description, FIG. 4 to FIG. 6 as well as FIG. 1 are referred. FIG. 4 and FIG. 5 are cross sectional views illustrating an example state of the processing target object in the middle of performing the etching method shown in FIG. 1. Further, FIG. 6 is a cross sectional view illustrating an example state of the processing target object after the etching method of FIG. 1 is completed.

As depicted in FIG. 1, in the method MT, the process ST1 is first performed as described above. In the process ST1, the wafer W is carried into a processing vessel of a plasma processing apparatus and is mounted on a mounting table therein. In case of using the plasma processing apparatus 10, the wafer W is mounted on the electrostatic chuck 18. Then, a voltage from the DC power supply 22 is applied to the electrode 18a of the electrostatic chuck 18, so that the wafer W is attracted and held by the electrostatic chuck 18.

Thereafter, in the method MT, a process ST2 is performed. In the process ST2, plasma of a first processing gas is generated within the processing vessel of the plasma processing apparatus ("first plasma process"). The first processing gas contains one or more kinds of fluorocarbon gases and an oxygen gas ($O_2$ gas). In the present exemplary embodiment, the first processing gas may contain a $C_4F_6$ gas and a $C_4F_8$ gas as the fluorocarbon gas. Further, in the present exemplary embodiment, the first processing gas may further contain a hydrofluorocarbon gas and/or a rare gas. By way of non-limiting example, a $CH_2F_2$ gas may be used as the hydrofluorocarbon gas. As the rare gas, any kind of rare gas can be used. For example, an Ar gas may be used as the rare gas.

In the process ST2, the pressure in the space within the processing vessel is set to have a preset pressure. Further, in the process ST2, a temperature of the electrostatic chuck is set to a first temperature. The first temperature is higher than a second temperature serving as a temperature of the electrostatic chuck which is set in a process ST3 to be described later. In the exemplary embodiment, the first temperature is in the range from 20° C. to 40° C. Further, since the wafer W receives radiant heat from the plasma, a temperature of the wafer W is higher than the temperature of the electrostatic chuck by about 10° C. to about 15° C. Accordingly, in the process ST2, the temperature of the wafer W is set to be in the range from 30° C. to 55° C. Further, in the process ST2, the first processing gas supplied into the processing vessel is excited, so that the plasma is generated.

In case of using the plasma processing apparatus 10, in the process ST2, the first processing gas is supplied into the processing vessel 12 from the gas source selected from the gas sources belonging to the gas source group 40. Further, a pressure in the space within the processing vessel 12 is set to the preset pressure by the gas exhaust device 50. In addition, the temperature of the electrostatic chuck 18 is set to the first temperature by the chiller unit CU and/or the heater 18h. Furthermore, the high frequency power from the first high frequency power supply 62 and the high frequency bias power from the second high frequency power supply 64 are applied to the lower electrode 16. As a result, the plasma of the first processing gas is generated within the processing vessel 12.

Below, ranges of various conditions in the process ST2 are specified as an example.
Flow rate of $C_4F_6$ gas: 20 sccm to 100 sccm
Flow rate of $C_4F_8$ gas: 20 sccm to 100 sccm
Flow rate of $CH_2F_2$ gas: 20 sccm to 100 sccm
Flow rate of Ar gas: 100 sccm to 500 sccm
Flow rate of oxygen gas: 20 sccm to 200 sccm
Frequency of high frequency power of the first high frequency power supply 62: 27 MHz to 100 MHz
High frequency power of the first high frequency power supply 62: 100 W to 5000 W
Frequency of high frequency bias power of the second high frequency power supply 64: 400 kHz to 3 MHz
High frequency bias power of the second high frequency power supply 64: 500 W to 7000 W
Pressure within the processing vessel 12: 2.66 Pa to 13.3 Pa (20 mTorr to 100 mTorr)
Processing time: 180 sec to 600 sec In the process ST2, as depicted in FIG. 4, a portion of the first region R1 exposed through an opening OP of the mask MSK is etched, so that a space SP1 is formed in the first region R1. Further, a portion of the second region R2 exposed through an opening OP of the mask MSK is etched, so that a space SP2 is formed in the second region R2. Further, in the etching of the process ST2, a deposit DP is formed on a surface of the mask MSK and on wall surfaces of the spaces formed by the etching. The deposit DP is formed of, for example, carbon, fluorocarbon and/or an etching byproduct.

The etching by the plasma of the first processing gas in the process ST2 is characterized in that an etching rate of the second region R2 is higher than an etching rate of the first region R1. Further, in the etching by the plasma of the first processing gas, the deformation degree of the formed space at a bottom portion (deep portion) thereof increases. Further, in the etching by the plasma of the first processing gas, the higher the temperature of the electrostatic chuck, i.e., the temperature of the wafer W becomes, the smaller the deformation degree of the openings OP of the mask MSK becomes, though the etching rate of the first region R1 decreases. Here, the term "deformation" of a space or an opening refers to a phenomenon that a planar shape of the space or the opening on a plane orthogonal to a depth direction thereof becomes different from a required planar shape. For example, in case that the required planar shape is a circular shape, the deformation of the space or the opening refers to a phenomenon that the actually formed space or opening has a planar shape different from the circular shape.

Since the etching by the plasma of the first processing gas has the above-described characteristics, the space SP2 formed in the second region R2 is deeper than the space SP1 formed in the first region R1 upon the completion of the process ST2. Further, the deformation degree of the spaces SP1 and SP2 at the bottom portions thereof is increased. In addition, in the process ST2, since the temperature of the electrostatic chuck is set to the first temperature which is relatively high, the etching by the plasma of the first processing gas is performed in the state that the temperature of the wafer W is set to a relatively higher temperature. Accordingly, the deformation degree of the openings OP of the mask MSK is decreased after the process ST2 is completed.

Subsequently, in the method MT, a process ST3 is performed. In the process ST3, plasma of a second processing gas is generated within the processing vessel of the plasma processing apparatus ("second plasma process"). The second processing gas contains a hydrogen gas ($H_2$ gas), a nitrogen trifluoride gas ($NF_3$ gas), a hydrogen bromide gas (HBr gas) and a carbon-containing gas. The carbon-containing gas contained in the second processing gas is any gas containing carbon, and, for example, may be a hydrocarbon gas such as a methane gas ($CH_4$ gas). In the present exemplary embodiment, the second processing gas may further contain a hydrofluorocarbon gas and/or a fluorocarbon gas. As an example of the hydrofluorocarbon gas, a $CH_2F_2$ gas may be used. Further the fluorocarbon gas may be, for example, a $CF_4$ gas.

In the process ST3, the pressure in the space within the processing vessel is set to have a predetermined pressure. Further, in the process ST3, the temperature of the electrostatic chuck is set to the second temperature. The second temperature is lower than the first temperature. In the present exemplary embodiment, the second temperature is lower than 20° C. Further, since the wafer W receives radiant heat from the plasma, the temperature of the wafer W in the process ST3 is set to be lower than 30° C. Furthermore, in the process ST3, the second processing gas supplied into the processing vessel is excited, so that the plasma is generated.

In case of using the plasma processing apparatus 10, in the process ST3, the second processing gas is supplied into the processing vessel 12 from the gas source selected from the gas sources belonging to the gas source group 40. Further, the pressure in the space within the processing vessel 12 is set to the predetermined pressure by the gas exhaust device 50. In addition, the temperature of the electrostatic chuck 18 is set to the second temperature by the chiller unit CU and/or the heater 18h. Furthermore, the high frequency power from the first high frequency power supply 62 and the high frequency bias power from the second high frequency power supply 64 are applied to the lower electrode 16. As a result, the plasma of the second processing gas is generated within the processing vessel 12.

Below, ranges of various conditions in the process ST3 are specified as an example.

Flow rate of $H_2$ gas: 50 sccm to 300 sccm
Flow rate of HBr gas: 5 sccm to 50 sccm
Flow rate of $NF_3$ gas: 50 sccm to 100 sccm
Flow rate of $CH_2F_2$ gas: 40 sccm to 80 sccm
Flow rate of $CH_4$ gas: 5 sccm to 50 sccm
Flow rate of $CF_4$ gas: 20 sccm to 100 sccm
Frequency of high frequency power of the first high frequency power supply 62: 27 MHz to 100 MHz
High frequency power of the first high frequency power supply 62: 100 W to 5000 W
Frequency of high frequency bias power of the second high frequency power supply 64: 400 kHz to 13.56 MHz
High frequency bias power of the second high frequency power supply 64: 1000 W to 7000 W
Pressure within the processing vessel 12: 2.66 Pa to 13.3 Pa (20 mTorr to 100 mTorr)
Processing time: 180 sec to 600 sec In the process ST3, as depicted in FIG. 5, the portion of the first region R1 exposed through the opening OP of the mask MSK is further etched, so that the space SP1 is deepened. Further, the portion of the second region R2 exposed through the opening OP of the mask MSK is further etched, so that the space SP2 is deepened. Further, during the etching of the process ST3, the deposit DP is formed on the surface of the mask MSK and on the wall surfaces of the spaces formed by the etching. The deposit DP is formed of, for example, carbon, hydrocarbon and/or an etching byproduct.

The etching by the plasma of the second processing gas in the process ST3 is characterized in that the etching rate of the first region R1 is higher than the etching rate of the second region R2, and the deformation degree of the formed spaces at the bottom portions thereof is small. Further, in the etching by the plasma of the second processing gas, the lower the temperature of the electrostatic chuck, i.e., the temperature of the wafer W becomes, the higher the etching rate of the first region R1 becomes. Further, in the etching by the plasma of the second processing gas, when the temperature of the electrostatic chuck, i.e., the temperature of the wafer W is low, it is possible to suppress occurrence of a phenomenon that a portion of the space in the depth direction thereof is enlarged in a transverse direction (orthogonal to the depth direction of the spaces)

The etching by the plasma of the second processing gas has the above-described characteristics. Accordingly, after the process ST3 is completed, a difference in a depth of the space SP1 formed in the first region R1 and a depth of the space SP2 formed in the second region R2 is reduced or removed. Further, the deformation degree of the spaces at the bottom portions thereof that has occurred in the process ST2 is decreased after the process ST3 is completed. Thus, by performing the process ST2 and the process ST3 in sequence, the depths of the spaces formed in the first region R1 and the second region R2 becomes substantially same, and the deformation degree of the spaces at the bottom portions thereof is decreased. Furthermore, in the process ST3, since the temperature of the electrostatic chuck is set to the second temperature which is relatively low, the etching by the plasma of the second processing gas is performed in the state that the temperature of the wafer W is set to a relatively lower temperature. Accordingly, in the process ST3, the enlargement of the space in the transverse direction can be suppressed, and the etching rate of the first region R1 is increased.

In a subsequent process STJ of the method MT, it is determined whether a stop condition is satisfied. Specifically, it is determined that the stop condition is satisfied when a sequence including the process ST2 and the process ST3 has been repeated a preset number of times. The preset number of times may be one (1) or a plural number. In case that the preset number of times is just one, the process STJ is not necessary. In the present exemplary embodiment where the preset number of times is set to be the plural number, if it is determined in the process STJ that the stop condition is not satisfied, the process ST2 and the process ST3 are sequentially performed again. Meanwhile, if it is determined in the process STJ that the stop condition is satisfied, the sequence including the process ST2 and the process ST3 is ended. Further, in the exemplary embodiment where the preset number of times is set to be the plural number, processing times of the process ST2 and the process ST3 in each sequence are set to be shorter than processing times of the process ST2 and the process ST3 in the example where the preset number of times is set to be one. As stated above, by performing the sequence including the process ST2 and the process ST3 multiple times, it is possible to etch the first region R1 and the second region R2, while reducing the difference in the depths of the spaces formed in the first region R1 and the second region R2 and the deformation degree of the spaces.

In the method MT according to the present exemplary embodiment, the process ST2 and the process ST3 are performed until immediately before the underlying layer UL is exposed. That is, the process ST2 and the process ST3 are performed such that the first region R1 and the second region R2 are slightly left on the underlying layer. Then, a subsequent process ST4 is performed. In the process ST4, plasma of the third processing gas is generated within the processing vessel of the plasma processing apparatus. As the third processing gas, the same gas as the first processing gas may be used.

In the process ST4, the pressure in the space within the processing vessel is regulated to a predetermined pressure. Further, in the process ST4, the temperature of the electrostatic chuck is set to a third temperature. The third temperature is higher than the first temperature. In the present exemplary embodiment, the third temperature is set to be equal to or higher than 70° C. Further, since the wafer W receives radiant heat from the plasma, the temperature of the wafer W is higher than the temperature of the electrostatic chuck by about 10° C. to about 15° C. Accordingly, in the process ST4, the temperature of the wafer W is set to be equal to or higher than 80° C. Further, in the process ST4, the third processing gas supplied into the processing vessel is excited, so that the plasma is generated.

In case of using the plasma processing apparatus 10, in the process ST4, the third processing gas is supplied into the processing vessel 12 from the gas source selected from the gas sources belonging to the gas source group 40. Further, the pressure in the space within the processing vessel 12 is set to the predetermined pressure by the gas exhaust device 50. In addition, the temperature of the electrostatic chuck 18 is set to the third temperature by the chiller unit CU and/or the heater 18h. Furthermore, the high frequency power from the first high frequency power supply 62 and the high frequency bias power from the second high frequency power supply 64 are applied to the lower electrode 16. As a result, the plasma of the third processing gas is generated within the processing vessel 12.

Below, ranges of various conditions in the process ST4 are specified as an example.

Flow rate of $C_4F_6$ gas: 20 sccm to 100 sccm
Flow rate of $C_4F_8$ gas: 20 sccm to 100 sccm
Flow rate of $CH_2F_2$ gas: 20 sccm to 100 sccm
Flow rate of Ar gas: 100 sccm to 500 sccm
Flow rate of oxygen gas: 20 sccm to 100 sccm
Frequency of high frequency power of the first high frequency power supply 62: 27 MHz to 100 MHz
High frequency power of the first high frequency power supply 62: 500 W to 2700 W
Frequency of high frequency bias power of the second high frequency power supply 64: 400 kHz to 13.56 MHz
High frequency bias power of the second high frequency power supply 64: 1000 W to 7000 W
Pressure within the processing vessel 12: 2.66 Pa to 13.3 Pa (20 mTorr to 100 mTorr)
Processing time: 180 sec to 600 sec In the process ST4, as depicted in FIG. 6, the portions of the first region R1 and the second region R2 exposed through the openings OP of the mask MSK are further etched, so that the underlying layer UL is exposed via the spaces SP1 and SP2. Further, during the etching of the process ST4, the deposit DP is formed on the surface of the mask MSK and on the wall surfaces of the spaces formed by the etching in the same manner as in the etching of the process ST2.

The plasma of the third processing gas generated in the process ST4 does not substantially etch the underlying layer. Further, in the process ST4, since the temperature of the electrostatic chuck is set to the third temperature which is relatively high, the temperature of the wafer W is increased, so that an adhesion coefficient of active species to the underlying layer UL is reduced. Therefore, it is possible to suppress damage of the underlying layer UL that might be caused by the etching during a period in which the underlying layer UL is exposed.

In the above, the method MT according to the exemplary embodiment has been described. However, the above-described exemplary embodiment is not limiting, and various change and modifications may be made. By way of example, the plasma processing apparatus in which the method MT is performed is not limited to the capacitively coupled plasma processing apparatus, and various other types of plasma processing apparatus such as an inductively coupled plasma processing apparatus or a plasma processing apparatus with a surface wave such as a microwave as a plasma source may be used. Further, although the method MT includes the process ST4, the underlying layer UL may be exposed by performing the process ST2 and the process ST3, and, in such a case, the process ST4 may be omitted.

Hereinafter, experimental examples conducted to evaluate the method MT will be described. Here, however, it should be noted that these experimental examples do not limit the present disclosure.

Experimental Example 1

In the experimental example 1, a plurality of wafers is prepared, and each of the wafers includes a multilayered film in which multiple silicon oxide films and multiple silicon nitride films are alternately stacked on top of each other; and a mask provided with substantially circular openings on the multilayered film. Each silicon oxide film has a thickness of 50 nm, and each silicon nitride film has a thickness of 50 nm. The total number of layers of the silicon oxide films is forty eight (48), and the total number of layers of the silicon nitride films is also forty eight (48). The mask is made of amorphous carbon and has a film thickness of 1500 nm. The opening of the mask has a diameter of 120 nm and has a substantially circular planar shape. In the experimental example 1, the plasma of the first processing gas is generated in the plasma processing apparatus 10, and the hole is formed in the multilayered film by etching the multilayered film. When etching the multilayered films of the wafers, the temperature of the electrostatic chuck is set to different temperatures for the individual wafers. Below, processing conditions other than the temperature of the electrostatic chuck in the experimental example 1 are specified.

Processing Conditions in Experimental Example 1

Flow rate of $C_4F_6$ gas: 40 sccm
Flow rate of $C_4F_8$ gas: 30 sccm
Flow rate of $CH_2F_2$ gas: 25 sccm
Flow rate of Ar gas: 400 sccm
Flow rate of oxygen gas: 35 sccm
Frequency of high frequency power of the first high frequency power supply 62: 100 MHz
High frequency power of the first high frequency power supply 62: 1250 W
Frequency of high frequency bias power of the second high frequency power supply 64: 400 kHz
High frequency bias power of the second high frequency power supply 64: 700 W
Pressure within the processing vessel 12: 3.333 Pa (25 mTorr)
Processing time: 600 sec Then, a SEM image of the opening of the mask and a SEM image of the bottom portion of the hole formed in the multilayered film after the etching of the multilayered film are acquired, and a degree of roundness of the opening of the mask and a degree of roundness of the hole at the bottom portion thereof are obtained. Further, the etching rate of the multilayered film is also calculated. To obtain the degree of roundness of the opening of the mask, twenty four (24) line segments that pass through an approximate center of the opening of the mask and end at an edge of the opening are obtained on the SEM image of the opening, and, among line lengths of the 24 line segments, a minimum line length divided by a maximum line length is calculated as the degree of roundness of the opening of the mask. Likewise, to calculate the degree of roundness at the bottom portion of the hole, 24 line segments that pass through an approximate center of the hole at the bottom portion thereof and end at an edge of the hole at the bottom portion thereof are obtained on the SEM image of the hole, and, among line lengths of the 24 line segments, a minimum line length divided by a maximum line length is calculated as the degree of roundness of the hole at the bottom portion thereof. The degree of roundness of the opening of the mask and the degree of roundness of the hole at the bottom portion thereof are parameters each of which indicates that the opening or the hole is closer to a perfect circle as the degree approaches 1.

Figure 7:
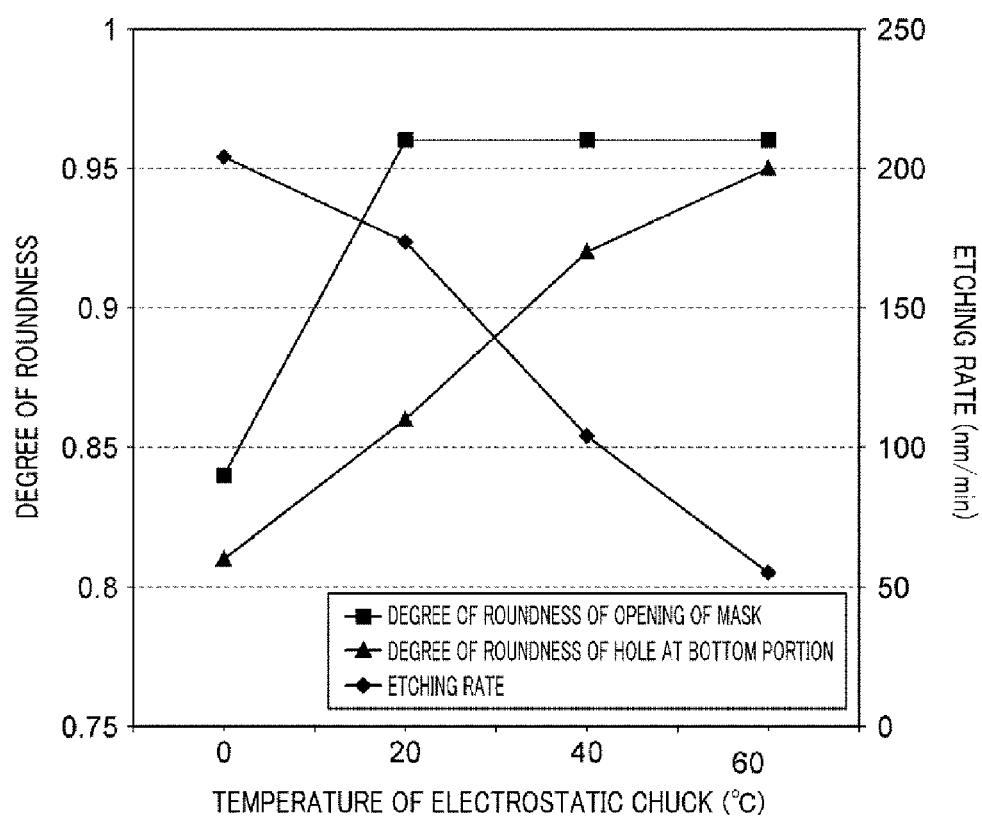
FIG. 7 is a graph showing a result of an experimental example 1.

FIG. 7 is a graph showing the degree of roundness of the opening of the mask, the degree of roundness of the hole at the bottom portion thereof, and the etching rate of the multilayered film obtained in the experimental example 1. In FIG. 7, a horizontal axis indicates the temperature of the electrostatic chuck when etching the multilayered film; a left vertical axis, the degree of roundness; and a right vertical axis, the etching rate. As can be seen from FIG. 7, it is found out that, in the etching by the plasma of the first processing gas, the etching rate of the multilayered film decreases as the temperature of the electrostatic chuck increases. Further, it is also found out that the degree of roundness of the hole at the bottom portion thereof, which is formed by the etching with the plasma of the first processing gas, is lower than the degree of roundness of a hole at the bottom portion thereof, which is formed by etching with plasma of a second processing gas (refer to a result of an experimental example 2 to be described later). That is, it is found out that the deformation degree of the space at the bottom portion thereof, which is formed by the etching with the plasma of the first processing gas, is relatively high. Further, it is also found out that, in the etching with the plasma of the first processing gas, the degree of roundness of the opening of the mask increases as the temperature of the electrostatic chuck increases. That is, it is found out that, in the etching by the plasma of the first processing gas, the deformation degree of the opening of the mask decreases as the temperature of the electrostatic chuck increases. Moreover, it is also found out that the etching rate equal to or higher than 100 nm/min and the degree of roundness of the opening of the mask equal to or higher than 0.95 can be obtained by setting the temperature of the electrostatic chuck in the range from 20° C. to 40° C.

Experimental Example 2

In the experimental example 2, a plurality of wafers, which are the same as the wafers prepared in the experimental example 1, is prepared. Then, the plasma of the second processing gas is generated in the plasma processing apparatus 10, and the hole is formed in the multilayered film of the wafer W by etching the multilayered film. When etching the multilayered films of the wafers, the temperature of the electrostatic chuck is set to different temperatures for the individual wafers. Below, processing conditions other than the temperature of the electrostatic chuck in the experimental example 2 are specified.

Processing Conditions in Experimental Example 2

Flow rate of $H_2$ gas: 105 sccm
Flow rate of HBr gas: 40 sccm
Flow rate of $NF_3$ gas: 70 sccm
Flow rate of $CH_2F_2$ gas: 65 sccm
Flow rate of $CH_4$ gas: 35 sccm
Frequency of high frequency power of the first high frequency power supply 62: 60 MHz
High frequency power of the first high frequency power supply 62: 2500 W
Frequency of high frequency bias power of the second high frequency power supply 64: 400 kHz
High frequency bias power of the second high frequency power supply 64: 4000 W
Pressure within the processing vessel 12: 4 Pa (30 mTorr)
Processing time: 333 sec Then, a SEM image of an upper portion of the hole formed in the multilayered film, i.e., a SEM image of the hole in the vicinity of an interface between the multilayered film and the mask is obtained, and a SEM image of a bottom portion of the hole is also acquired. Further, a width of the hole at the upper portion thereof and a degree of roundness of the hole at the bottom portion thereof are obtained. Further, an etching rate of the multilayered film is also obtained. The degree of roundness of the hole at the bottom portion thereof is calculated by the same method as in the experimental example 1.

Figure 8:
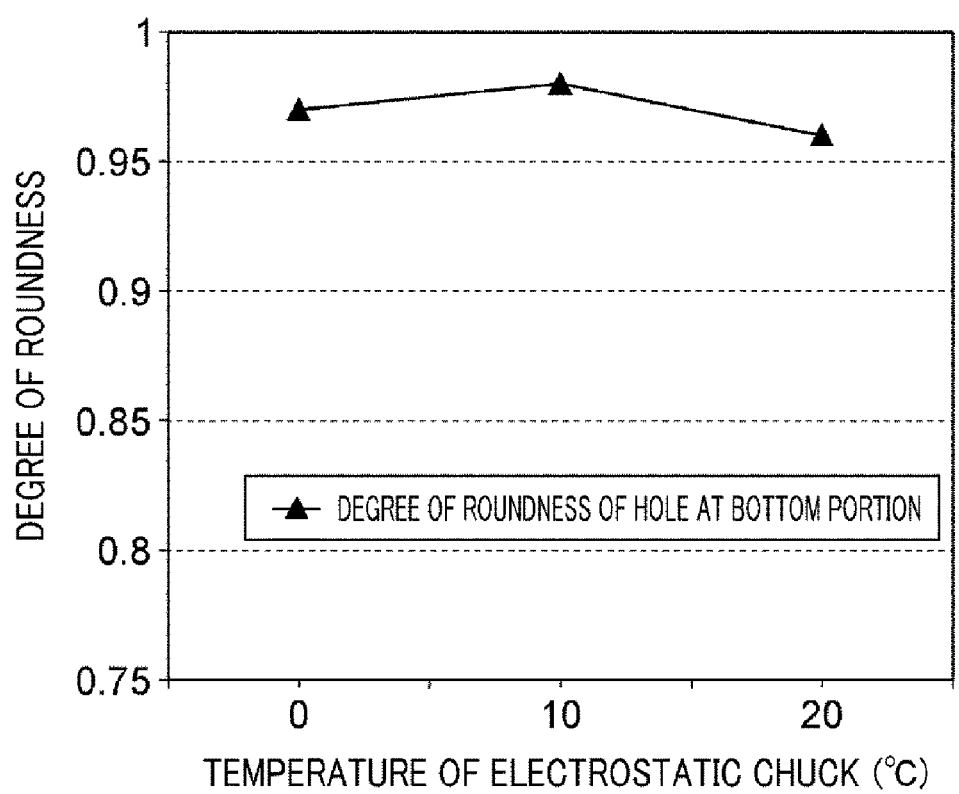
FIG. 8 is a graph showing a result of an experimental example 2.
Figure 9:
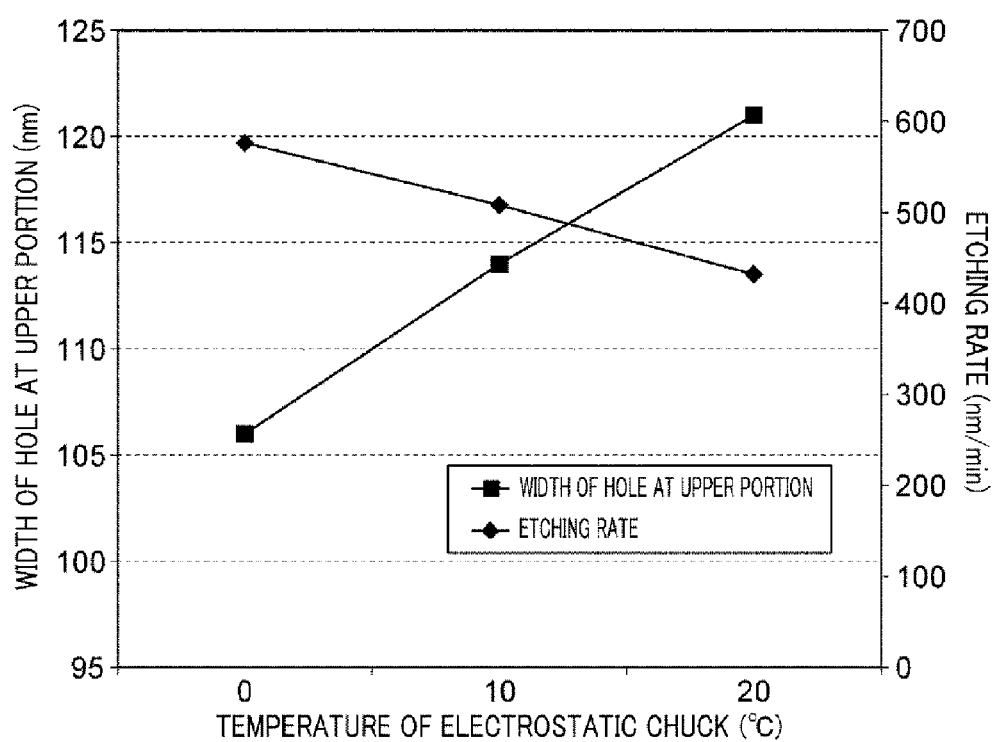
FIG. 9 is a graph showing a result of the experimental example 2.

FIG. 8 is a graph showing the degree of roundness of the hole at the bottom portion thereof, obtained in the experimental example 2, and FIG. 9 is a graph showing the etching rate and the width of the hole at the upper portion thereof, obtained in the experimental example 2. In FIG. 8, a horizontal axis indicates the temperature of the electrostatic chuck when etching the multilayered film; a left vertical axis, the width of the hole at the upper portion thereof; and a right vertical axis, the etching rate. As can be seen from FIG. 8, it is found out that, in the etching by the plasma of the second processing gas, the degree of roundness of the hole at the bottom portion thereof is improved regardless of the temperature of the electrostatic chuck. That is, it is found out that, in the etching by the plasma of the second processing gas, the deformation degree of the space at the bottom portion thereof, which is formed by the etching, is reduced regardless of the temperature of the electrostatic chuck. Further, as can be seen from FIG. 9, it is also found out that, in the etching by the plasma of the second processing gas, the higher etching rate can be obtained as the temperature of the electrostatic chuck is decreased. In addition, it is also found out that, in the etching by the plasma of the second processing gas, the width of the hole at the upper portion thereof decreases as the temperature of the electrostatic chuck decreases. That is, it is found out that, in the etching by the plasma of the second processing gas, a phenomenon that a portion of the formed space is enlarged in the transverse direction can be effectively suppressed as the temperature of the electrostatic chuck is decreased. Further, it is also found out that, in the etching by the plasma of the second processing gas, a sufficiently high etching rate can be obtained and the enlargement of the space in the transverse direction can be sufficiently suppressed if the temperature of the electrostatic chuck is set to be lower than 20° C.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:
1. An etching method of etching a first region and a second region of a processing target object, the first region including a multilayered film in which silicon oxide films and silicon nitride films are alternately stacked, the second region consisting of a single-layered silicon oxide film, and the processing target object including a mask provided with openings on the first region and the second region, the etching method comprising:

mounting the processing target object on an electrostatic chuck provided within a processing vessel of a plasma processing apparatus;

generating plasma of a first processing gas containing a fluorocarbon gas and an oxygen gas within the processing vessel to etch the first region and the second region simultaneously; and generating plasma of a second processing gas containing a hydrogen gas, a nitrogen trifluoride gas, a hydrogen bromide gas and a carbon-containing gas within the processing vessel to etch the first region and the second region simultaneously, wherein a temperature of the electrostatic chuck is set to a first temperature in the generating of the plasma of the first processing gas, and the temperature of the electrostatic chuck is set to a second temperature lower than the first temperature in the generating of the plasma of the second processing gas.

2. The etching method of claim 1,
wherein the first temperature is in the range from 20° C. to 40° C., and the second temperature is lower than 20° C.

3. The etching method of claim 1,
wherein the openings are holes.

4. The etching method of claim 1, further comprising:
generating plasma of a third processing gas containing a fluorocarbon gas and an oxygen gas within the processing vessel to etch the first region and the second region simultaneously, wherein the processing target object includes, as a base of the first region and the second region, an underlying layer made of silicon or tungsten, the generating of the plasma of the first processing gas and the generating of the plasma of the second processing gas are performed until immediately before the underlying layer is exposed, and the temperature of the electrostatic chuck is set to a third temperature higher than the first temperature in the generating of the plasma of the third processing gas.

5. The etching method of claim 4,
wherein the third temperature is equal to or higher than 70° C.

6. The etching method of claim 1,
wherein a sequence including the generating of the plasma of the first processing gas and the generating of the plasma of the second processing gas is repeated multiple times.

\* \* \* \* \*